(12) United States Patent
Hou et al.

(10) Patent No.: US 8,255,777 B2
(45) Date of Patent: Aug. 28, 2012

(54) SYSTEMS AND METHODS FOR LOCATING ERROR BITS IN ENCODED DATA

(75) Inventors: Ping Hou, Fremont, CA (US); Eugen Gershon, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 860 days.

(21) Appl. No.: 12/368,835

(22) Filed: Feb. 10, 2009

(65) Prior Publication Data

US 2010/0205513 A1  Aug. 12, 2010

(51) Int. Cl.
 *H03M 13/00* (2006.01)
(52) U.S. Cl. ...................................................... 714/785
(58) Field of Classification Search .................. 714/755, 714/781–785
See application file for complete search history.

(56) References Cited

U.S. PATENT DOCUMENTS

| | | | | |
|---|---|---|---|---|
| 4,476,562 A | * | 10/1984 | Sako et al. | 714/756 |
| 4,958,349 A | * | 9/1990 | Tanner et al. | 714/759 |
| 5,905,740 A | * | 5/1999 | Williamson | 714/784 |

OTHER PUBLICATIONS

Son Le-Ngoc & Zhenpen Young; An Approach to Double Error Correcting Reed-Solomon Decoding Without Chien Search; pp. 534-537, Aug. 16-18, 1993.

* cited by examiner

*Primary Examiner* — Shelly A Chase

(57) ABSTRACT

Systems and methods for identifying error bits in encoded data are disclosed. As a part of identifying error bits, encoded data that is provided from a data source and that includes data and parity check portions is accessed. Based on the encoded data, syndromes are calculated, and based on the calculated syndromes, an equation is determined. The roots of the equation are determined and based on the determined roots of the equation, one or more error bits are identified. The error bits are identified using a circuit that presents a binary representation of the roots. The error bits are corrected based on the error bits that are identified.

18 Claims, 5 Drawing Sheets

SYSTEMS AND METHODS FOR LOCATING ERROR BITS IN ENCODED DATA

BACKGROUND

Data storage systems write data to and read data from media. The data is first written to and later read from the media. Such media can include hard disks and memory. The memory can include a variety of flash memory types. Data that is written to media can contain error bits. To address the problem of error bits data can be encoded with error-correcting codes (ECC) that allow error bits to be identified and corrected at read. BCH codes are a type of error-correcting code. The acronym BCH comprises the initials of its inventors Bose, Ray-Chaudhuri and Hocquenghem. An important advantage of BCH codes is that they can be decoded via an algebraic method known as syndrome decoding. Syndromes identify error patterns of received data. Syndrome decoding enables decoding to be performed by electronic hardware which can obviate the need for a computer to perform these tasks efficiently.

BCH codes were developed in the late 1950's and early 1960's. These codes are used in satellite communications, data storage systems, digital communications and mobile communications among other technological applications. Because of its algebraic structure, a typical BCH code constructed over a finite or "Galois" field $GF(2^m)$ where m is a positive integer of at least three, can correct up to t random error bits with mt redundant bits where t is less than half of $(2^m-1)$. In particular, a $(2^m-1, 2^m-1-mt)$ BCH code can encode K data bits and generate N encoded bits where $K=2^m-1-mt$ and $N=2^m-1$.

One of the conventional methodologies that is suitable for VLSI architecture for decoding BCH codes includes three sequential stages: (1) syndrome calculation, (2) Key Equation determination, and (3) the performance of a Chien Search. Syndrome calculation based on a $(2^m-1)$-bit received codeword will yield t syndromes that possess information related to error bit location. Additionally, the t syndromes can indicate when a received codeword is error-free and can be used to derive the aforementioned Key Equation in cases where at least some of the t syndromes are not zero.

The Key Equation is a polynomial whose order indicates the actual number of error bits that are located within a binary data block and whose roots implicitly project error bit locations. Unfortunately, such projections are nonlinear over $GF(2^m)$ (through a mapping of exponential function) and consequently the identification of error bits directly via the Key Equation is difficult. Conventional approaches use a so-called Chien search where VLSI circuits are employed to exhaustively test all bit locations with the corresponding powers as inputs so as to determine the error bit locations.

As it regards the implementation of conventional decoding methodologies such as that discussed above, the calculation of syndromes involves a fixed procedure that is defined by algebraic coding architecture, e.g., defined by BCH codes. Moreover, there are many types of methodologies that can be used to obtain the Key Equation from the obtained syndromes, such as, for example, Euclidean approaches or the use of a Berlekamp algorithm. However, when t (the number of random error bits) is small, the Key Equation can be obtained using manipulated syndromes. The execution of a Chien search requires that nonlinear mapping from each bit location is inserted into the Key Equation to determine if it satisfies the Key Equation. If a nonlinear mapping satisfies the Key Equation, then its corresponding bit location is determined to contain an error bit.

Conventional methodologies such as those discussed above can involve extensive testing of bit locations and thus exhibit less than satisfactory operating speeds (error locating time). Moreover, the hardware that is required to implement the systems can be excessive and thus manufacturing complexity and cost can be unsatisfactory. In addition, many of the conventional systems are limited as it relates to reliability, efficiency and operating range.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Systems and methods for identifying error bits in encoded data are disclosed. As a part of identifying error bits, encoded data that is provided from a data source and that includes data and parity check portions is accessed. Based on the encoded data, syndromes are calculated and based on the syndromes an equation is determined. The roots of the equation are determined and based on the roots that are determined one or more error bits are identified. The error bits are identified using a circuit that presents a binary representation of the roots. The error bits are corrected based on the error bits that are identified.

BRIEF DESCRIPTION OF THE DRAWINGS

The accompanying drawings, which are incorporated in and form a part of this specification, illustrate embodiments and, together with the description, serve to explain the principles of the embodiments.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1A:
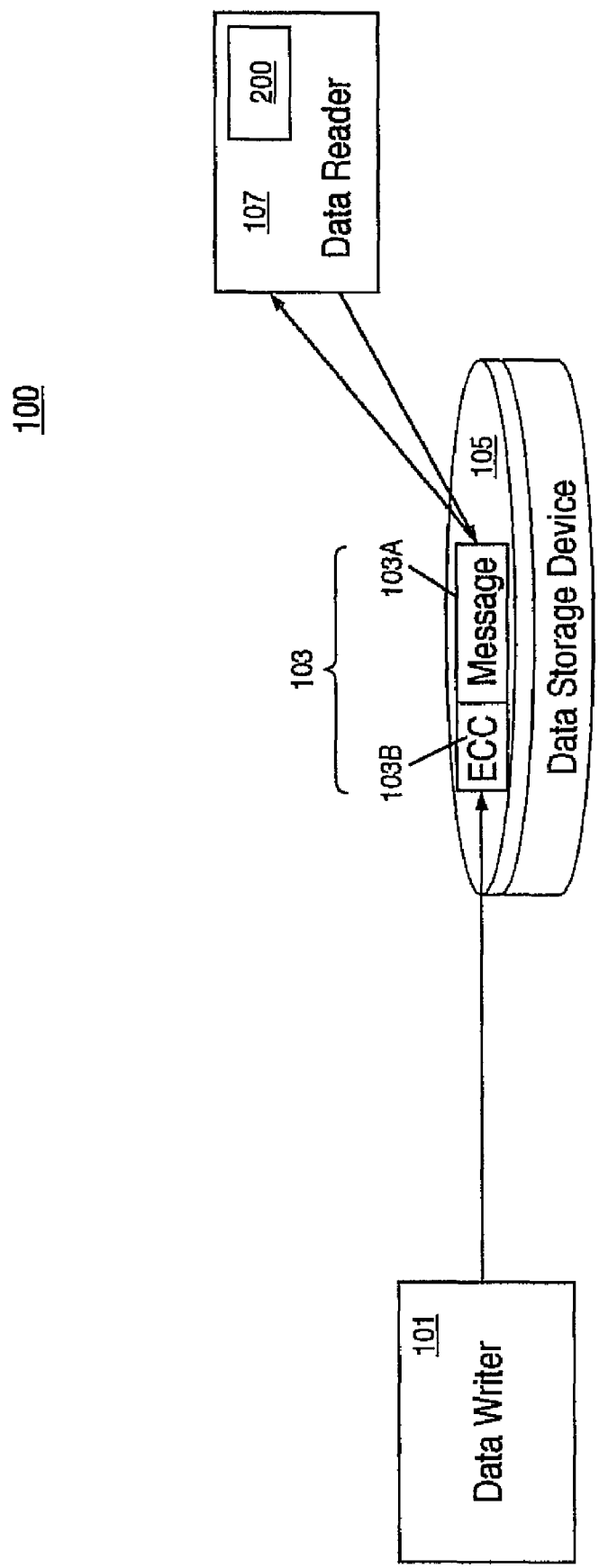
FIG. 1A shows an exemplary operational setting for a system for identifying error bits in encoded data according to one embodiment.

Exemplary Operational Setting for a System for Locating Error Bits in Encoded Data According to Embodiments FIG. 1A shows an exemplary operational setting 100 for a system 200 for locating error bits in transmitted/writtten data according to one embodiment. In one embodiment, system 200 locates error bits in data that is written to a storage device when the data is read. FIG. 1A shows data writer 101, data 103, data storage device 105, data reader 107 and system 200.

Referring to FIG. 1A, data writer 101 writes data 103 to data storage device 105. The data that is written comprises bits of data that can be read by data reader 107. In one embodiment, the bits of data are encoded to produce a codeword that can include a message portion 103A and a check portion 103B (e.g., redundancy check portion etc.). It should be appreciated that errors may be present in the data that is read by data reader 107. These errors are termed "error bits." Error bits can develop from a variety of causes.

Data storage device 105 stores data that is written to it by data writer 101 and provides access to the data to data reader 107. In one embodiment, data storage device 105 can comprise a flash array device. In other embodiments, data storage device 105 can include other type data storage devices. It should be appreciated that characteristics of the data writing, storage and reading process can contribute to error bits or the number of bits of a data stream that are altered. For example, noise in data storage device 105 such as in the format of an analog signal, can cause the alteration of the waveform corresponding to data 103 that is written by data writer 101 and read by data reader 107. Moreover, data loss or data change can also be causes of changes in expected value at read.

Data reader 107 reads data that is written to data storage device 105 (with noise and/or disturbance) by data writer 101. In one embodiment, data reader 107 can include a decoder for decoding information that is read from data storage device 105. In one embodiment, system 200 can reside at data reader 107 and form a portion of such a decoder. In other embodiments, system 200 can be separate from data reader 107 but can function cooperatively with components and operations thereof. In one embodiment, error bits in the encoded data stream that is read by data reader 107 can be corrected through operation of system 200. In one embodiment, the process of correcting error bits begins with an identification of the information in data 103 that is not error-free.

In one embodiment, as a part of the operation of system 200, in one embodiment, system 200 accesses data that is read by data reader 107, calculates syndromes based on the received data and based on the calculated syndromes, determines or formulates an equation (which in one embodiment is linear or quadratic in form). In one embodiment, roots of the equation are identified by solving the determined equation, and one or more error bits are identified in the received data based on the identified roots. In one embodiment, the error bits are identified based on the identified roots using a circuit that determines the logarithm of the determined roots or a lookup table if the size of the table is not large (or other approaches). In one embodiment, the logarithm of the roots can be used in a relation whose solution identifies the error bit location. In one embodiment, based on the identified error bits a correction of the identified error bits can be effected. Systems and methodologies used to determine the logarithm of the roots are described in detail herein.

It should be appreciated that exemplary embodiments can significantly reduce decoding latency and involve a considerably smaller gate count for a large size encoding block as compared with conventional systems. It should be appreciated that embodiments of the present invention are not limited to correcting errors in encoded data that is accessed from storage devices but can be applied to any encoded data such as data that is transmitted over wired or wireless media.

Operation

Figure 1B:
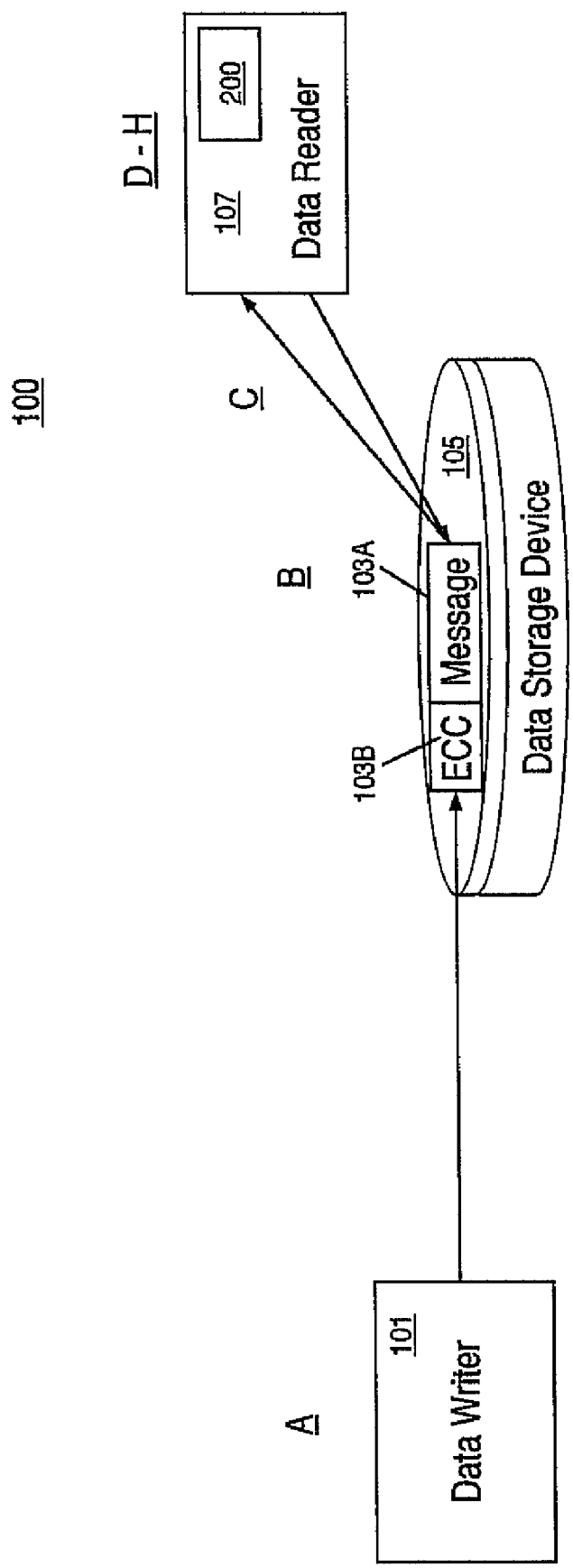
FIG. 1B illustrates operations performed in a process for locating error bits in encoded data according to one embodiment.
Figure 1C:
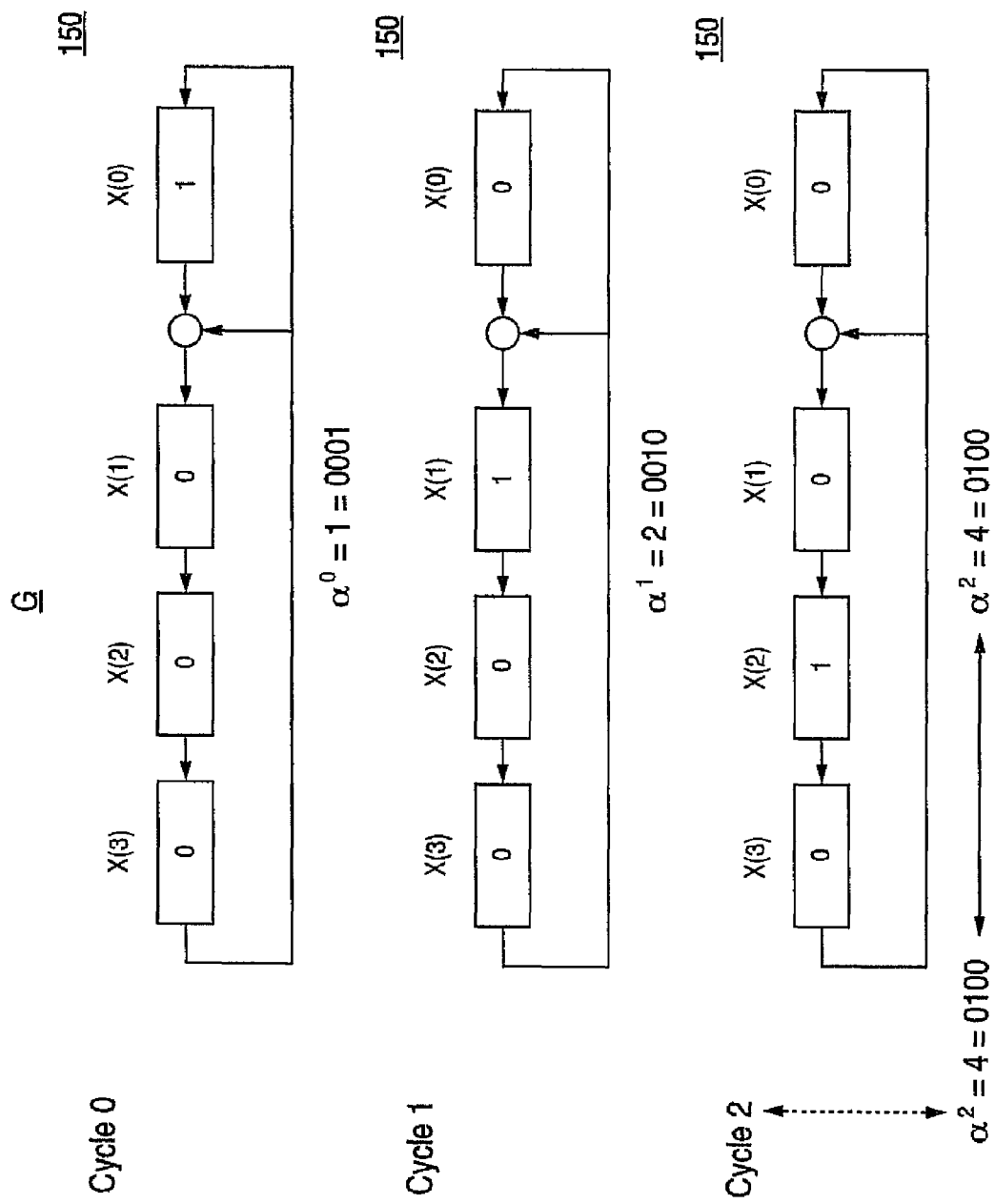
FIG. 1C shows a circuit that can be used to determine the logarithm of roots of the Key Equation according to one embodiment.

FIGS. 1B and 1C illustrate operations A-H performed in a process for locating error bits in encoded data according to one embodiment. These operations including the order in which they are presented are only exemplary. In other embodiments, other operations in other orders can be included.

At A, a message is encoded at data writer 101. In one embodiment, based on the encoding, codeword data that includes a message portion and a check portion is generated.

At B, the encoded data is written to a data storage device by data writer 101 and accessed therefrom by data reader 107. In one embodiment, noises and/or disturbances in the transmission path or media from which the data is accessed causes the transmitted data or stored data to exhibit error bits.

At C, the data that is accessed by data reader 107 is accessed by system 200, which is a part of, or is associated with data reader 107. In one embodiment, because the data that is accessed by data reader 107 may contain error bits, the correction of the error bits enables a satisfactory processing of the data that is accessed by receiver 107 (such as to present to end user).

At D, E and F, through action of system 200, syndromes are calculated (D) based on the received data and based on the calculated syndromes, an equation is determined (E) where the roots of the determined equation are identified (F) by solving the determined equation. The calculation of syndromes, the determination or formulation of the Key Equation, and the determination of the roots of the Key equation are discussed herein in detail.

At G, location or index of the error bit is identified based on the identified roots using a circuit that determines the logarithm of roots. FIG. 1C shows a circuit that can be used to perform the power operations associated with G over the finite field defined by polynomial $p(D)=D^4+D+1$. In one embodiment, the error bit can be identified in the following manner where roots of the Key Equation are determined to be equal to four. Based on a determination that the roots of the Key Equation are equal to four, the circuit can be advanced until it presents a binary four via circuit stages x(0) through x(3). In one embodiment, the logarithm of the determined root is identified by the clock cycle that causes the circuit to present a binary four (in the FIG. 1C example it is two) at its plurality of stages. This value is used in a relation that when solved identifies the location of an error bit. It should be appreciated that although the example described above involved roots that are equal to four, the circuit shown in FIG. 1C can determine the logarithm of other roots as well. It should be appreciated that in accordance with one embodiment, the above discussed processes should be followed for each of the determined roots.

Referring again to FIG. 1B, at H, based on the identified error bits a correction of the identified error bits can be effected.

Exemplary Error Bit Identification Implementation Details

Single Error Bit Decoding

In one embodiment, an error bit locating methodology is provided (see operations detailed with reference to FIG. 1B). In particular, in one embodiment, where t (the number of random error bits) is equal to two, up to two error bits can be corrected. Upon obtaining syndromes from incoming data, e.g., 103 in FIG. 1A, (from which the coefficients in the Key Equation can be determined) the Key Equation which has the quadratic form $ax^2+bx+c=0$ can be determined. However, if a is equal to zero, the presence of a single error bit is indicated. In such cases, using the Key Equation, finding $x=cb^{-1}$ is straightforward, which enables the corresponding error bit to be identified and readily corrected.

In contrast, in cases where a is not equal to zero additional operations may be involved. Some conventional methodologies that use conventional search techniques use $\alpha^1$ in place of x in the Key Equation. If $\alpha^1$ is a root, namely $a(\alpha^1)^2+b\alpha^1+c=0$, then $(2^m-1)-1$ will result in the final location of the error bit. However, it should be appreciated that, due to multiplication and power, where $a \neq 0$ the implementation complexity involved in determining the final location of the error bit using a conventional Chien search is not trivial.

Double Error Bit Decoding

Determining Key Equation from Syndromes

In one embodiment, when data (e.g., 103 in FIG. 1A) that is written to a data storage device (e.g., 101 in FIG. 1A) and is read therefrom by the data reader (e.g., 107 in FIG. 1A) syndromes related to the data are calculated. In one embodiment, syndromes provide an error pattern of the received data. In one embodiment, syndromes S1 and S3 are calculated in the following way: assume the received (e.g., corrupted etc.) polynomial is y(D), the syndromes thus are defined as $S_i=y(\alpha^i)$ where i=1 and 3. It should be appreciated that for syndromes S1 and S3, where S1=0 and S3=0 a received codeword is error free, where S1 is $\neq 0$ and S3=0 then a single error is indicated and where S1$\neq$0 and S3$\neq$0 a double error is indicated. In one embodiment, the syndromes S1 and S3 provide information from which the coefficients of the Key Equation can be determined. In one embodiment, $a=(S3+S1^3)/S1$, $b=S1$ and $c=1$. Based on the coefficients determined from the calculated syndromes, the Key Equation $ax^2+bx+c=0$ can be determined.

Obtaining Roots of the Key Equation

In one embodiment, to find the roots of the Key Equation (see operation F in FIG. 1B), a transform $y=ax/b$ can be used to obtain $y^2+y+(ac/b^2)=0$. It should be appreciated that as it regards the aforementioned transform, neither a nor b is zero, otherwise two distinct roots would not be involved and the assumption that there are two error bits would be violated. As it regards the aforementioned equation, if $y_1$ is a root then the other root $y_2$ is equal to y+1 over a finite field. It should be appreciated that conventional techniques for solving quadratic equations can be used to determine $y_1$. It should be appreciated that based on the aforementioned transform $y=ax/b$, the solution to the Key Equation is given by roots $x_1=(y_1*b/a)$ and $x_2=(y_1*b/a+b/a)$.

In one embodiment, to obtain $(ac/b^2)$, one can either first find $b^{-1}$ and to obtain $a*b^{-1}$ and $c*b^{-1}$ before calculating their product, or use an extended Euclidean approach to directly find $a*b^{-1}$ and $c*b^{-1}$. It should be appreciated that the strengths of each approach as it regards latency and timing can be considered in determining which approach to use for a particular application. In one embodiment, the values of the roots determined through the aforementioned processes can be used to identify the location of error bits. In one embodiment, this can be accomplished by determining the logarithm of the roots as discussed below.

Consider the quadratic equation $y^2+y+k=0$ where k is over finite field $GF(2^m)$. The solution of the above quadratic equation over $GF(2^m)$ is dependent on m. Accordingly, it should be appreciated that: (1) if m is odd (which is most used in design), one root is $\Sigma k^{2**i}$ where i=1, 3, 5, ..., m-1; (2) if m is even, the root computation may be complex and conventional solutions can be employed.

Finding the Logarithm of Roots

FIG. 1C shows a circuit 150 that can be used to determine the logarithm of the roots $x_1$ and $x_2$ over a given non-trivial finite field defined by the specific primitive polynomial $p(D)=D^4+D+1$ where the roots can be represented by $\alpha^1$ as discussed above. In this manner, the power 1 of the root $\alpha^1$ can be determined and used in the relation $(2^m-1)-1$ to identify the location of the error bit.

In one embodiment, as discussed herein, a typical BCH code constructed over a finite field $GF(2^m)$ where m is a positive integer can correct up to t random error bits with mt redundant bits. If m is not large, a look-up table can be used to determine the logarithms of the Key Equation roots, however, if m is large, maintaining a pre-computed look-up table can be very costly. As an example, if m is equal to 10, there would need to be a maximum data set of $(2^{10}-1)$ 10-bit words maintained in storage. In one embodiment, storage can be handled at low cost for large m by dynamically generating the logarithm table before the expected logarithm value is reached. Circuit 150 of FIG. 1C, implements a discrete logarithm algorithm which can determine the logarithm of roots $x_1$ and $x_2$ of an associated Key Equation. As is well-known, each BCH code is established over a finite field $GF(2^m)$ and is generated by a primitive polynomial whose coefficient is binary.

For example, in one embodiment, $p(D)=D^4+D+1$ can be used to generate finite field $GF(2^4)$ over which a BCH code can be established. Using $p(D)=D^4+D+1$ as an example, powers of $\alpha$ can be determined using circuit 150 that is shown in FIG. 1C. Circuit 150 includes stages x computed [3], x[2], x[1] and x[0]. In one embodiment, when circuit 150 is initialized for a power of $\alpha$ equal to zero, the circuit state is given by x[3]=0, x[2]=0, x[1]=0 and x[0]=1, that is, state [0 0 0 1], which corresponds to $\alpha^0$. As states are updated at each clock cycle, the power that is represented is increased by one. Consequently, one can generate $\alpha^j$ after shifting for j cycles: when shifted j times, the message given by x[3:0] will provide the value of $\alpha^j$. More specifically, as the clock advances to the expected circuit state (that which is equivalent to the root for which the logarithm is being sought), for states x[m-1], ..., x[0], the counter value will give the value of power (the logarithm of the root).

In one embodiment, to reduce the time consumed for finding power, the processing performed by circuit 150 depicted in FIG. 1C, can be performed in parallel. In particular, the logarithm circuit can start with some specific states corresponding to a variety of power value, and run with an initial state of [0,0, ... 0,1] is implemented. The property of cyclic codes (where BCH belongs to family of cyclic codes) dictates values for different powers are never identical and hence initial powers of parallel circuits can be selected in a manner which will ensure that none of powers will occur more than once during the process. Since the two circuits run simultaneously, half time can be saved and hence the initial state/initial power of the second circuit can be determined in advance. Exemplary embodiments can include 64-way, 128-way etc., parallel searches using the same circuit.

Exemplary Optimizations

In one embodiment, implementation considerations can include optimizations related to gate count and latency. In particular, gate count can be reduced by avoiding a Chien search. Additionally, because of the regular structure in syndrome calculation, computation for powers of $\alpha$, in one embodiment, may not be needed. Instead, since the ratio between two adjacent powers is a constant, the use a specific multiplier can be used to obtain the sequence of powers of α in real time, e.g., the new power equals to the old power multiplied by a constant. Such a specific multiplier has much lower gate count in comparison with a general multiplier due to optimizations that involve an input of a constant.

In summary, in one embodiment, multipliers and inverters can be used repeatedly to solve the Key Equation. In one embodiment, conventional approaches for calculating inverse can be modified to enhance speed. In some conventional systems the following theorem can be used to find the inverse of an element over $GF(2^m)$ that is, $\beta^{-1}=\beta^{(2^{}m-2)}$ for any non-zero β over $GF(2^m)$. As $2^{}m-2=2^m-2=2^1+2^2+2^3+\ldots+2^{(m-1)}$, value of $\beta^{(2^{**}j)}$ (j=1, ..., m−1) are needed to know before getting their product, or $\beta^{-1}$. To speed up processing and in consideration of polynomial bases in one embodiment, β can be represented as $$\beta = \Sigma \beta(i) \alpha^i$$

where i=0, 1, ..., m−1, and β(i) is either zero or one. By using the property of binary addition, $$\begin{aligned}\beta^{(2^{}j)} &= (\Sigma\beta(i)\alpha^i)^{2^{}j} \\ &= \Sigma\beta(i)\alpha^{i*(2^{**}j)} \text{ for } j=1,\ldots,m-1 \text{ and } i=0,\ldots,m-1 \\ &= \beta(0) + \Sigma\beta(i)\alpha^{i*(2^{**}j)} \text{ for } j=1,\ldots,m-1 \text{ and } \\ & \quad i=1 \text{ and } i=1,\ldots,m-1 \end{aligned}$$

Consequently by calculating the $i*(2^{}j)$-th power of α and saving this information in advance, and using binary input β, $\beta^{2^{}j}$ can immediately be obtained for j=1, ..., m−1. The remaining calculations involve obtaining the product of (m−1) terms, which involves (m−2) multiplications that involves $[\log_2(m-1)]$ cycles if each multiplication is assumed to be done within one cycle. Here [x] is the smallest positive integer which is larger than x.

For example, if m=13, in one embodiment, a corresponding inversion can be completed in four cycles and thus the inversion involves the use of four multipliers. Regarding multipliers used in solving the Key Equation, in one embodiment, as many as two multipliers may be involved if pipelining multiplication operations can be employed and time consumed is still quite low.

Exemplary Cost Advantages

It should be appreciated that 4096-bit sectors are widely used in storage system and flash memory storage (such as may be associated with receiver 107 in FIG. 1A). According to coding theory, the smallest integer necessary for m to cover 4096 data bits is 13. Over $GF(2^{13})$ the 2-bit correctable BCH needs 26 redundant bits and hence overall there are 4122 encoded bits. In one embodiment, a shortened (4122, 4096) double error bit correcting BCH code can be used. To solve the quadratic Key Equation over $GF(2^{13})$, using the exemplary algorithm discussed above, two inversions are needed to obtain $b^{-1}$ and $a^{-1}$ respectively and then multiplications follow to obtain $ab^{-1}$, the product of $ab^{-1}$ and $b^{-1}$, and $ba^{-1}$ sequentially. By pipelining, the aforementioned operations can be performed with one inverter and one multiplier in order to minimize gate count. It should be appreciated that a multiplier can perform the multiplication in one cycle. When the roots of the Key Equation are known (e.g., $x_1$ and $x_2$), one can implement the log function through the parallel use of multiple flip-flop circuits as shown in FIG. 1C with different initial states. Since within x=0 to 8191 α's are different, one can carefully select initial states for the logarithm circuit so that they will not have overlap states before a search over 4096 data bits is ended. It should be appreciated that in exemplary embodiments, the gate count for a circuit such as that shown in FIG. 1C plus that required for solving the Key Equation as discussed above is much lower than that used for multiplier (especially for large m), which significantly reduces gate count while maintaining search efficiency. Accordingly, exemplary embodiments operate to minimize both gate count and latency as compared to the conventional searches.

If ECC decoding latency is most concerned, the log function through the parallel implementation of multiple flip-flop circuits may not be used. Instead, a look-up table with multiple entries can be employed for finding the power of α. More specifically, a static look-up table may be established in advance which has value of $\alpha^i$ where i=0,1, ..., N−1 for a positive integer N where N indicates the number of parallel search branches. For any given value β, to find the corresponding power of k such that $\beta=\alpha^k$, a comparison of β with the N entries from the look-up table can be made and if a match can be found then the power k can be thus obtained; otherwise, $\beta*\alpha^{-N}$ can be calculated and the result compared with the N table entries, in case $\beta*\alpha^{-N}=\alpha^P$, e.g., $\alpha^{N+p}=\beta$; this computation can repeat until $\alpha^{N*k+p}=\beta$, e.g., $\beta*\alpha^{-N*k}=\alpha^P$ holds after the kth round trial. Apparently as N increases, the table size will be correspondingly increased while the number of trials on the average will be reduced, which in turn decreases latency at cost of more gates for the saved table in advance. Note that since N is a constant, $\alpha^{-N}$ is a constant and $\beta*\alpha^{-N}$ does not need a multiplier where combinatorial logic (with the functionality of multiplication) to represent $\alpha^{-N}$ can be used to achieve the product.

Figure 2:
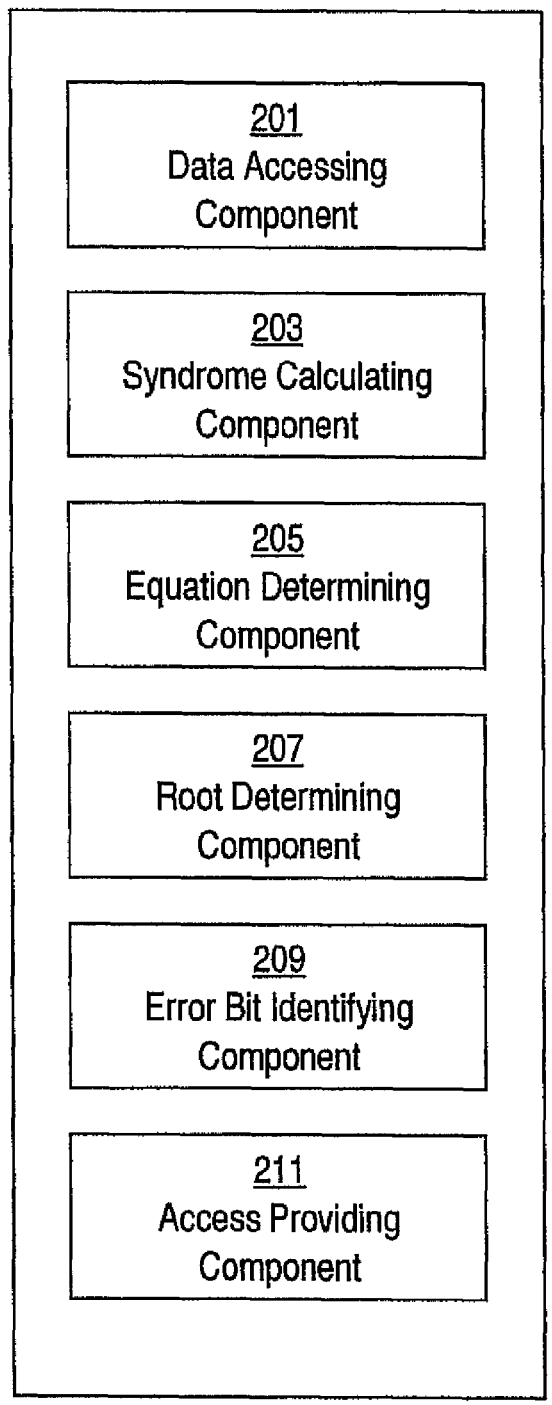
FIG. 2 shows components of a system for identifying error bits in encoded data according to one embodiment.

Exemplary Components of System for Identifying Error Bits in Encoded Data According to Embodiments FIG. 2 shows components of system 200 for identifying error bits in encoded data according to one embodiment. In one embodiment, component 200 implements an algorithm for identifying error bits in encoded data for error bit correction. In the FIG. 2 embodiment, system 200 includes data accessing component 201, syndrome calculating component 203, equation determining component 205, root determining component 207, error bit identifying component 209 and access providing component 211.

It should be appreciated that the aforementioned components of system 200 can be implemented in hardware or in a combination of hardware and software. In one embodiment, components and operations of system 200 can be encompassed by components and operations of one or more electronic systems (e.g., computer, controller, other data receiver, etc.). In another embodiment, components and operations of system 200 can be separate from the aforementioned one or more electronic systems but can operate cooperatively with components and operations thereof.

Referring to FIG. 2, data accessing component 201 accesses encoded data that is provided by a data source (e.g., data writer 101 in FIG. 1A). In one embodiment, the data can include a message portion and a check portion.

Syndrome calculating component 203 calculates one or more syndromes (e.g., S1 and S3 discussed in the previous section) based on the data that is received. In one embodiment, the syndromes provide error pattern information and information from which the coefficients of the Key Equation, which is discussed in detail herein, can be determined. In one embodiment, for Key Equation coefficients a and b, a=(S3+S1^3)/S1 and b=S1. In other embodiments, coefficients can have other values. Based on the coefficients determined from the syndromes that are calculated by syndrome calculating component 203, the Key Equation $ax^2+bx+c=0$ can be determined.

Equation determining component 205 determines the Key Equation from which error bits can be identified based on the calculated one or more syndromes. In one embodiment, the equation can be quadratic in form as is discussed in detail herein (see above).

Root determining component 207 determines the roots of the Key Equation. In one embodiment, root determining component 207 includes at least one inverter and at least one multiplier. In other embodiments, root determining component 207 can include other components.

Error bit identifying component 209 functions to locate one or more error bits in encoded data that is received from a data source (e.g., data writer 101 in FIG. 1A). In one embodiment, error bit identifying component 209 locates error bits based on the determined roots of the Key Equation. In one embodiment, error bit identifying component 209 includes a discrete root logarithm determining circuit that determines the logarithm of the determined roots (see FIG. 1C). This value is then used in an equation whose solution identifies the location of the error bit.

Access providing component 211 provides an identifier of the error bit location to a system for correcting the error bits. In this manner identified error bits can be corrected at a data receiver (e.g., data reader 107 in FIG. 1A).

Figure 3:
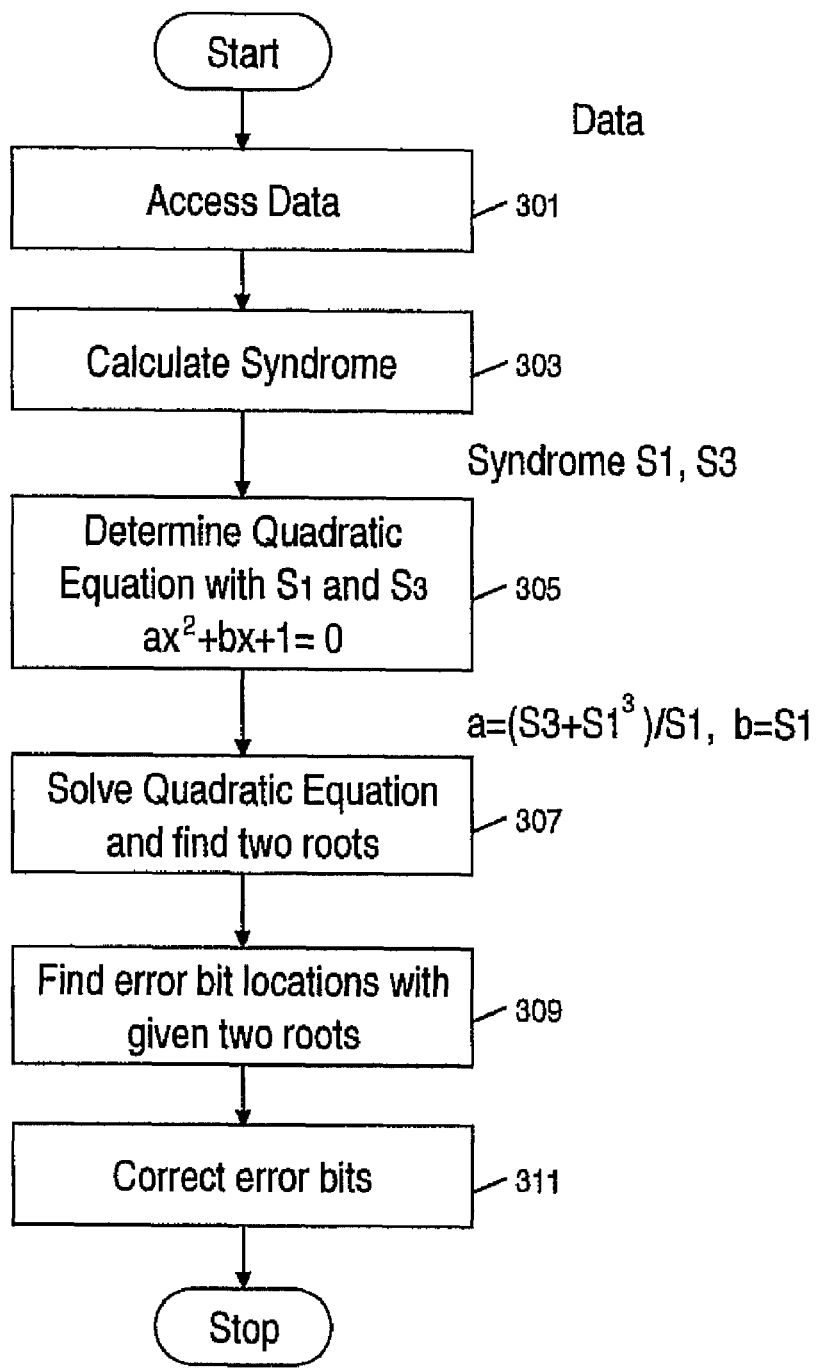
FIG. 3 shows a flowchart of the steps performed in a method for identifying error bits in encoded data according to one embodiment.

Exemplary Method for Identifying Error Bits in Encoded Data According to One Embodiment FIG. 3 shows a flowchart 300 of the steps performed in a method for identifying error bits in encoded data according to one embodiment. Although specific steps are disclosed in the flowcharts, such steps are exemplary. That is the exemplary embodiments are well suited to performing various other steps or variations of the steps recited in the flowcharts. Within various embodiments, it should be appreciated that the steps of the flowcharts can be performed by software, by hardware or by a combination of both.

Referring to FIG. 3, at 301, encoded data (including a message and check bit information) that is provided by an encoder is accessed.

At 303, one or more syndromes are calculated based on the data.

At 305, an equation is determined based on the aforementioned one or more syndromes.

At 307, two roots of the equation are determined by solving the equation.

At 309, one or more error bits are identified in the data based on the two roots using a circuit that presents a binary representation of the roots. In one embodiment, the circuit includes an exclusive or gate. In another embodiment, the circuit includes other components.

At 311, one or more error bits are corrected based on the identification of error bits made at 309.

With reference to exemplary embodiments thereof, systems and methods for identifying error bits in encoded data are disclosed. As a part of identifying error bits, encoded data that includes error detection bits is accessed. Based on the encoded data, syndromes are calculated and based on the syndromes that are calculated an equation is determined. The roots of the equation are determined and based on the determined roots one or more error bits are identified. The error bits are identified using a circuit that presents a binary representation of the roots. The error bits are corrected based on the error bits that are identified.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for identifying error bits in encoded data, comprising:
    at a data receiver, accessing encoded data that is provided by a data source wherein said encoded data comprises data and parity check portions;
    calculating one or more syndromes based on said encoded data;
    based on said one or more syndromes determining an equation;
    determining the roots of said equation;
    identifying one or more error bits in said data based on said roots using a circuit that presents a binary representation of said roots; and
    based on said identifying said one or more error bits, correcting said error bits, wherein a cycle count of a clock cycle of said circuit that causes said circuit to present said binary representation of said roots identifies a logarithm.

2. The method of claim 1 wherein said circuit generates a logarithm of said roots.

3. The method of claim 1 wherein the location of said one or more error bits are identified by finding a logarithm of said roots.

4. The method of claim 1 wherein said circuit comprises a first flip-flop that provides a first input to an exclusive or gate which provides an input to a plurality of series connected flip-flops the last of which provides a second input to said exclusive or gate and to said first flip-flop.

5. The method of claim 1 wherein said circuit is initialized with a multi-bit binary one.

6. The method of claim 1 wherein one or more circuits are coupled in parallel with said circuit.

7. The method of claim 1 wherein said roots are identified using at least one inverter and at least one multiplier.

8. In a decoder associated with a data receiver, a method for locating error bits in a stream of data for error bit correction, comprising:
    at said data receiver, accessing encoded data that is provided by a data source wherein said encoded data comprises error detection data that comprises data and parity check portions;
    calculating one or more syndromes based on said encoded data wherein said syndromes contain an error pattern of said data and parity check portions;
    based on said one or more syndromes determining an equation wherein said equation is quadratic in form;
    determining the roots of said equation;
    identifying one or more error bits in said encoded data based on said roots using a circuit that comprises a plurality of stages, wherein a binary representation of said roots is presented by said plurality of stages; and based on said identifying said one or more error bits, correcting said error bits to produce corrected data and processing said corrected data at said data receiver, wherein a cycle count of a clock cycle of said circuit that causes said circuit to present said binary representation of said roots identifies a logarithm.

9. The method of claim 8 wherein said circuit generates a logarithm of said roots.

10. The method of claim 8 wherein the location of said one or more error bits are identified by finding a logarithm of said roots.

11. The method of claim 8 wherein said circuit comprises a first flip-flop that provides a first input to an exclusive or gate which provides an input to a plurality of series connected flip-flops the last of which provides a second input to said exclusive or gate and to said first flip-flop.

12. The method of claim 8 wherein said circuit is initialized with a multi-bit binary number to correspond to an initial clock cycle.

13. The method of claim 8 wherein one or more circuits are coupled in parallel with said circuit.

14. The method of claim 8 wherein said roots are identified using at least one inverter and at least one multiplier.

15. A system for locating error bits in a stream of data for error bit correction, comprising:
  a data accessing component for accessing encoded data that is provided by a data source wherein said encoded data comprises data and parity check portions;
  a syndrome calculating component for calculating one or more syndromes based on said encoded data;
  an equation determining component for determining an equation based on said one or more syndromes;
  a root identifying component for identifying two roots by solving said equation;
  an error bit locating component for locating one or more error bits in said encoded data based on said two roots comprising a first circuit that comprises an exclusive or gate; and
  an access providing component for providing access to an identifier of said error bits to a system for correcting said error bits, wherein a cycle count of a clock cycle of said circuit that causes said circuit to present said binary representation of said roots identifies a logarithm.

16. The system of claim 15 wherein said first circuit comprises a first flip-flop that provides a first input to an exclusive or gate which provides an input to a plurality of series connected flip-flops the last of which provides a second input to said exclusive or gate and to said first flip-flop.

17. The system of claim 15 wherein said root identifying component comprises at least one inverter and at least one multiplier.

18. The system of claim 15 wherein said error bit locating component comprises one or more circuits that are coupled in parallel with said first circuit.

\* \* \* \* \*